(12) United States Patent
Hebert

(10) Patent No.: US 8,242,510 B2
(45) Date of Patent: Aug. 14, 2012

(54) MONOLITHIC INTEGRATION OF GALLIUM NITRIDE AND SILICON DEVICES AND CIRCUITS, STRUCTURE AND METHOD

(75) Inventor: Francois Hebert, San Mateo (CA)

(73) Assignee: Intersil Americas Inc., Milpitas, CA (US)

( * ) Notice: Subject to any disclaimer, the term of this patent is extended or adjusted under 35 U.S.C. 154(b) by 149 days.

(21) Appl. No.: 12/946,669

(22) Filed: Nov. 15, 2010

(65) Prior Publication Data

US 2011/0180806 A1 Jul. 28, 2011

Related U.S. Application Data

(60) Provisional application No. 61/299,013, filed on Jan. 28, 2010.

(51) Int. Cl.
*H01L 29/15* (2006.01)
(52) U.S. Cl. .......... 257/76; 257/E29.004; 257/E21.09; 257/E29.089; 438/22; 438/28; 438/172; 438/285
(58) Field of Classification Search .......... 257/76, 257/E29.004, E21.09, E29.089, 194, E29.246; 438/479, 28, 172, 22, 285
See application file for complete search history.

(56) References Cited

U.S. PATENT DOCUMENTS

| | | | |
|---|---|---|---|
| 6,210,987 B1 * | 4/2001 | Kurtz et al. | 438/47 |
| 6,741,623 B2 * | 5/2004 | Ishikawa et al. | 372/45.01 |
| 7,098,508 B2 * | 8/2006 | Ieong et al. | 257/347 |
| 7,129,103 B2 * | 10/2006 | Tanaka | 438/22 |
| 7,244,958 B2 * | 7/2007 | Shang et al. | 257/19 |
| 7,547,641 B2 * | 6/2009 | Ieong et al. | 438/739 |
| 7,626,246 B2 * | 12/2009 | Lochtefeld et al. | 257/647 |
| 7,723,751 B2 * | 5/2010 | Kawasaki et al. | 257/194 |
| 7,777,253 B2 * | 8/2010 | Sato | 257/194 |
| 7,795,642 B2 * | 9/2010 | Suh et al. | 257/194 |
| 7,799,592 B2 * | 9/2010 | Lochtefeld | 438/44 |
| 7,859,014 B2 * | 12/2010 | Nakayama et al. | 257/192 |
| 7,859,017 B2 * | 12/2010 | Sato | 257/192 |
| 7,875,958 B2 * | 1/2011 | Cheng et al. | 257/617 |
| 7,928,427 B1 * | 4/2011 | Chang | 257/24 |
| 7,985,987 B2 * | 7/2011 | Kaneko | 257/194 |
| 8,164,118 B2 * | 4/2012 | Kaneko | 257/194 |

(Continued)

OTHER PUBLICATIONS

Micovic, Miroslav et al., "GaN Double Heterojunction Field Effect Transistor for Microwave and Millimeterwave Power Applications," 2004, IEEE, pp. 33.4.1-33.4.4.

(Continued)

*Primary Examiner* — Hsien Ming Lee
*Assistant Examiner* — Ankush Singal
(74) *Attorney, Agent, or Firm* — Fogg & Powers LLC

(57) ABSTRACT

A structure and method for a semiconductor device includes a silicon device layer and a gallium nitride (GaN) device layer. In an embodiment, the silicon device layer and the GaN device layer have upper surfaces which are coplanar with each other. In another embodiment, the GaN device layer does not directly underlie the silicon device layer, and the silicon device layer does not directly underlie the GaN device layer. The semiconductor device can further include a silicon-based semiconductor device formed on and/or within the silicon device layer, and a nitride-based semiconductor device formed on and/or within the GaN device layer. The GaN device layer can include a plurality of layers which can be formed as conformal blanket layers and then planarized, or which can be selectively formed then planarized.

32 Claims, 13 Drawing Sheets

U.S. PATENT DOCUMENTS

| | | | | |
|---|---|---|---|---|
| 8,178,900 | B2* | 5/2012 | Kurachi et al. | 257/194 |
| 2001/0040246 | A1* | 11/2001 | Ishii | 257/192 |
| 2002/0121648 | A1* | 9/2002 | Hsu et al. | 257/194 |
| 2003/0020087 | A1* | 1/2003 | Goto et al. | 257/103 |
| 2003/0031219 | A1* | 2/2003 | Sawaki et al. | 372/45 |
| 2005/0032259 | A1* | 2/2005 | Nakajima et al. | 438/28 |
| 2005/0118752 | A1* | 6/2005 | Otsuka et al. | 438/172 |
| 2005/0181536 | A1* | 8/2005 | Tsuji | 438/105 |
| 2005/0258451 | A1* | 11/2005 | Saxler et al. | 257/192 |
| 2006/0068515 | A1* | 3/2006 | Li et al. | 438/22 |
| 2006/0076617 | A1* | 4/2006 | Shenoy et al. | 257/333 |
| 2006/0255401 | A1* | 11/2006 | Yang et al. | 257/328 |
| 2006/0292719 | A1* | 12/2006 | Lochtefeld et al. | 438/22 |
| 2007/0054465 | A1* | 3/2007 | Currie et al. | 438/455 |
| 2007/0267722 | A1* | 11/2007 | Lochtefeld et al. | 257/618 |
| 2008/0073667 | A1* | 3/2008 | Lochtefeld | 257/190 |
| 2008/0079009 | A1* | 4/2008 | Yaegashi | 257/77 |
| 2008/0087917 | A1* | 4/2008 | Briere | 257/194 |
| 2008/0099785 | A1* | 5/2008 | Bai et al. | 257/190 |
| 2008/0187018 | A1* | 8/2008 | Li | 372/50.11 |
| 2008/0303064 | A1* | 12/2008 | Sato | 257/194 |
| 2009/0057720 | A1* | 3/2009 | Kaneko | 257/194 |
| 2009/0219638 | A1* | 9/2009 | Iwata et al. | 360/59 |
| 2010/0244197 | A1* | 9/2010 | Arena et al. | 257/615 |
| 2011/0062438 | A1* | 3/2011 | Kaneko | 257/43 |
| 2011/0140176 | A1* | 6/2011 | Briere | 257/200 |

OTHER PUBLICATIONS

Daniels, P. R. et al., "Orientation Control of Bulk GaN Substrates Grown via Hydride Vapor Phase Epitaxy," CS Mantech Conference, May 18-21, 2009, Tampa, Florida, 3 Pages.

Brown, J.D. et al., "AlGaN/GaN HFETs fabricated on 100-mm GaN on silicon (111) substrates," Solid State Electronics, 46, 2002, pp. 1535-1539.

Chung, Jinwook W. et al., "On-Wafer Integration of Nitrides and Si Devices: Bringing the Power of Polarization to Si," 2009, Department of Electrical Engineering and Computer Science, Massachusetts Institute of Technology, 2009, pp. 1117-1120.

Xin, X.P. et al., "Optimization of AlGaN/GaN HEMT Ohmic Contacts for Improved Surface Morphology with Low Contact Resistance," CS Mantech Conference, May 17-20, 2010, Portland, Oregon, 4 Pages.

Xie, J. et al., "Characterization of GaN epitaxial films grown on SiNx and TiNx porous network templates," Gallium Nitride Materials and Devices, vol. 6121, Mar. 2006, pp. 85-96.

Heikman, Sten J., "MOCVD Growth Technologies for Applications in AlGaN/GaN High Electron Mobility Transistors," Electrical and Computer Engineering, University of California, Sep. 2002, pp. 1-203.

Berkman, Erkan Acar, "Growth and Fabrication on GaN and InxGa1-xN Based Optoelectronic Devices," Materials Science and Engineering, North Carolina State University, 2008, pp. 1-146.

* cited by examiner

US 8,242,510 B2

MONOLITHIC INTEGRATION OF GALLIUM NITRIDE AND SILICON DEVICES AND CIRCUITS, STRUCTURE AND METHOD

CROSS-REFERENCE TO RELATED APPLICATION

This application claims the benefit of U.S. provisional application Ser. No. 61/299,013 filed Jan. 28, 2010, which is incorporated herein by reference.

DESCRIPTION OF THE EMBODIMENTS

Reference will be made below in detail to exemplary embodiments of the present teachings, which can include a method and structure for a semiconductor device including a gallium nitride (GaN) device layer and silicon device layer as part of a semiconductor wafer substrate assembly, examples of which are illustrated in the accompanying drawings. The accompanying drawings, which are incorporated in and constitute a part of this specification, illustrate embodiments of the present teachings and together with the description, serve to explain the principles of the present teachings.

It should be noted that some details of the FIGS. have been simplified and are drawn to facilitate understanding of the embodiments of the present teachings rather than to maintain strict structural accuracy, detail and scale.

A semiconductor wafer substrate assembly which enables integration of both GaN-based devices and circuits as well as silicon-based devices and circuits monolithically would be desirable for various types of semiconductor components and systems. For example, high current power devices capable of operating at high currents (i.e., greater than one amp) over a wide range of operating voltages (i.e., between about 5 V to 1000 V), combined with control circuitry based on deep submicron complementary metal oxide semiconductor (CMOS) or bipolar-CMOS-DMOS (BCD) technologies would be advantageously formed on such a wafer. In particular, a wafer which includes GaN-based devices and silicon-based devices (silicon and silicon-germanium, SiGe, for example) formed as part of the same substrate with coplanar upper surfaces would be advantageous in the production of monolithic power products.

An embodiment of a method to provide such a semiconductor wafer substrate assembly having both GaN and silicon substrates is depicted in FIGS. 1-6, and described below.

Figure 1:
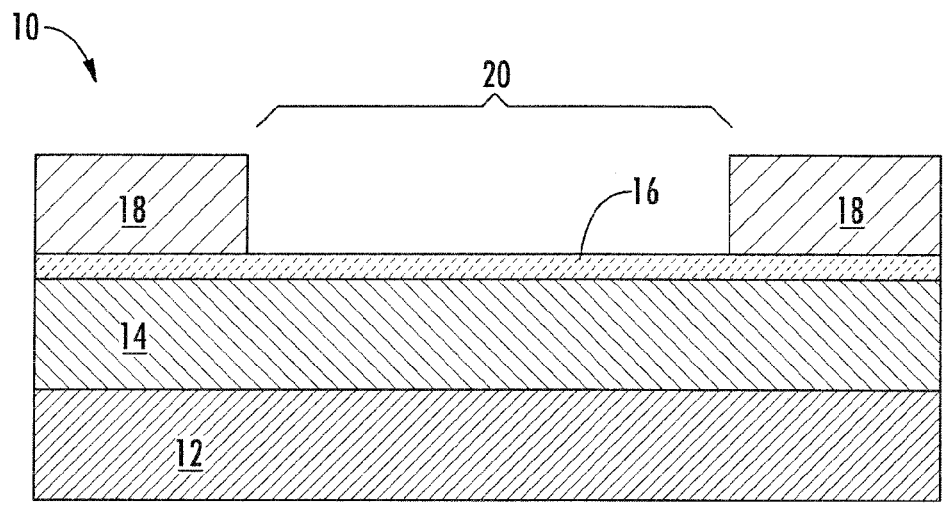
FIGS. 1-6 are cross sections of intermediate structures of an in-process device in accordance with an embodiment of the present teachings.

FIG. 1 depicts a structure 10, which can include a silicon-on-sapphire (SOS) structure having a sapphire layer 12 and a silicon layer 14. The sapphire layer 12 can be a cubic plane (i.e., a "C-plane") sapphire wafer as a substrate having a <0001> crystal orientation, and the silicon layer 14 can be a silicon wafer having a <100> crystal orientation. Sapphire wafers are commercially available, for example, from Kyocera of Kyoto, Japan and Rubicon of Franklin Park, Ill., and silicon on sapphire wafers are available from Monocrystal of Stavropol, Russia. The silicon layer 14 can be formed on the sapphire wafer 12 using an epitaxial growth process as known in the art, and may be doped or unndoped depending on the device being formed. In an embodiment, the sapphire wafer 12 can be between about 200 microns to about 700 microns thick, while the silicon layer 14 can be between about 0.1 microns (i.e., 1000 Å, 1.0 KÅ) to about 10 microns thick.

A hard mask layer 16 is formed over the surface of the silicon layer 14. The hard mask layer 16 can include oxide, nitride, or both, and can be formed using thermal oxidation, chemical vapor deposition (CVD), a pad oxide formation, or a combination. If oxide alone is used, the hard mask layer 16 can be between about 500 Å to about 10 KÅ thick. If nitride alone is used, the hard mask layer 16 can be between about 250 Å to about 5 KÅ thick. If both nitride and oxide are used, a nitride layer between about 250 Å and about 5 KÅ can be formed, followed by an oxide layer between about 100 Å and about 10 KÅ thick. In another embodiment, the oxide layer is formed first, followed by the nitride layer formation. A pad oxide between about 100 Å to about 300 Å can be formed under the nitride to reduce stress on the silicon. Multiple oxide and/or nitride layers may be formed, generally with silicon nitride as a top layer for blanket growth of various layers as described below. A polysilicon top layer may be used as a nucleation layer for polycrystalline growth of layers as described below over silicon layer 14, outside of where GaN devices will be formed. In the process of this embodiment, the hard mask 16 will include a top layer of silicon nitride. To complete the FIG. 1 structure, a patterned photoresist (resist) layer 18 is formed, for example, using conventional photolithoraphic techniques. An opening 20 within the resist will expose portions of the hard mask 16 and silicon layer 14, and will define a width of a subsequently formed GaN device layer. The width of opening 20 within resist 18 will depend on the device being formed.

Figure 2:
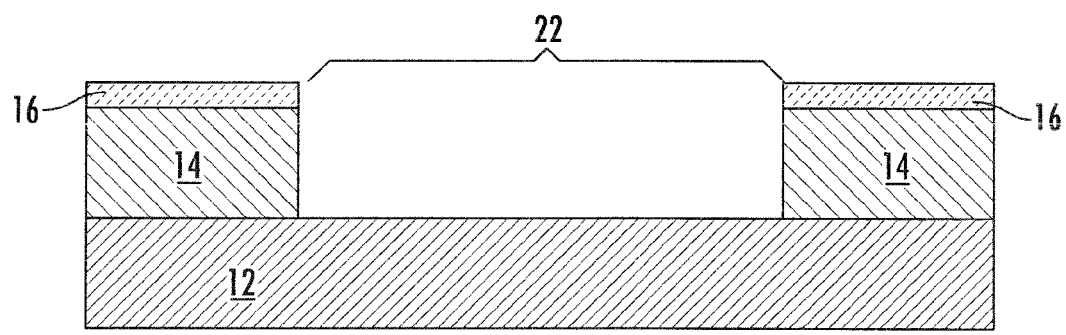

Next, etching is performed to remove the exposed hard mask 16 and silicon 14 as depicted in FIG. 2. A first etch can be used to remove the exposed hard mask 16, and a second etch can be used to remove the exposed silicon 14 and to stop on the sapphire 12. Oxide and nitride etches are well known in the art. A chemical etch which can remove silicon selective to sapphire includes fluorine- or chlorine-based chemistries, for example, using sulfur hexafluoride ($SF_6$), tetrafluoromethane ($CF_4$), chlorine ($Cl_2$), and combinations thereof with one or more gasses such as oxygen using standard reactive ion etching (RIE) or plasma etching techniques. The resist layer 18 can be removed either after etching the hard mask 16 and before etching the silicon layer 14 using the hard mask as a pattern, or after etching both the hard mask 16 and the silicon layer 14. After removing the resist layer 18, the FIG. 2 structure remains, with an opening 22 in the silicon layer 14 and the hard mask 16. In one exemplary process to form devices and circuits, opening 22 can be between about 10 microns to about 1000 microns.

Figure 3:
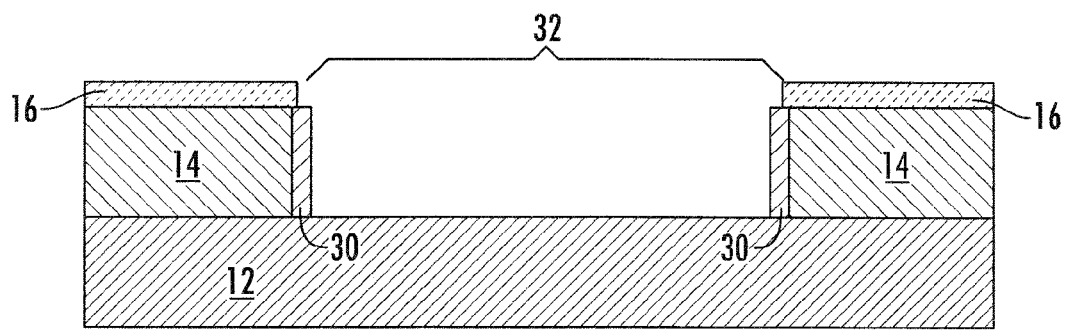

Subsequently, an unpatterned thermal oxidation of the FIG. 2 structure can be performed to result in the FIG. 3 structure. The thermal oxidation process oxidizes the exposed silicon layer 14 to form dielectric spacers 30, for example, including oxide, while the sapphire layer 12 and the hard mask 16 remain unoxidized. The thermal oxidation process used to form oxide 30 can also densify the hard mask layer 16 so that it is more resistant to an etch. In one exemplary process, the oxide spacers can be between about 250 Å and about 10 KÅ thick.

Figure 4:
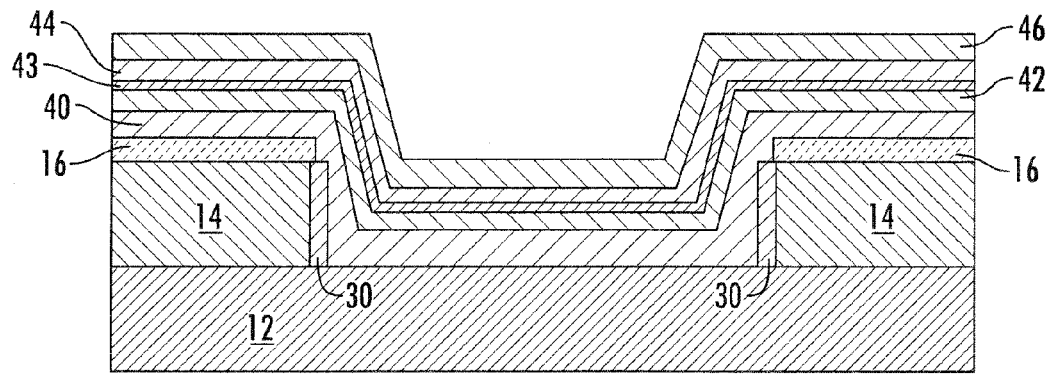

Next, as depicted in FIG. 4, various blanket conformal layers are formed to provide nitride-based device and circuit layers. These can include a stress relief layer 40 which contacts the sapphire layer, a buffer layer 42 formed on the stress relief layer 40, an optional binary barrier layer 43, a carrier donor layer 44, and an optional capping layer 46. Each of these layers can be formed from more than one individual layer.

The stress relief layer 40 which contacts the sapphire layer 12 can include one or more of aluminum nitride (AlN), GaN, and aluminum gallium nitride (AlGaN). The stress relief layer 40 can be formed as a blanket conformal layer using low temperature (LT, for example, between about 500° C. to about 1000° C.) or high temperature (HT, for example, greater than about 1000° C.) processing. A total thickness of the stress relief layer within the opening 22 in the silicon layer 14 can be between about 1 KÅ to about 20 KÅ. One embodiment can include a stress relief layer 40 with a bottom layer of AlN between about 100 Å and about 10 KÅ, a middle layer of GaN between about 5 KÅ and about 15 KÅ, and a top layer of AlGaN between about 100 Å and about 400 Å. The stress relief layer can be formed of alternating layers of AlN and GaN instead of a single AlN layer, or combinations of AlGaN/Al/GaN alternating layers. The stress relief layer may reduce damage to the sapphire layer from subsequently formed layers.

The buffer layer 42 can include a GaN layer between about 5 KÅ and about 50 KÅ, generally between about 1.0 microns to about 2.0 microns. The buffer layer 42 can be used to provide a transistor channel layer within which a two-dimensional electron gas (referred to as "2DEG") will be formed once an electron donor layer is deposited as discussed below. A suitable GaN layer can be formed using a process similar to that described above for the GaN stress relief layer. Additionally, the buffer layer 42 may include more than one layer. For example, the buffer layer 42 can include highly doped N-type (N+) buried region with a lightly doped N-type (N−) buffer layer. This configuration may be used for forming devices with vertical current flow such as diodes and bipolar transistors.

The optional binary barrier layer 43 can include an AlN layer, for example, between about 5 Å and 25 Å. If formed, this optional barrier layer 43 can improve the carrier density in the transistor channel formed between the buffer layer 42 and a subsequently formed carrier donor layer 44, described below. This layer 43 is referred to as a binary barrier layer as it can assist in confining the 2DEG. A suitable AlN binary barrier layer can be formed using a process similar to that described above for the AlN stress relief layer.

The carrier donor layer 44 can include one or more layers of AlGaN or indium aluminum nitride (InAlN), or both, and can have a thickness of between about 100 Å and about 400 Å. The carrier donor layer 44 can be an electron donor supply layer for a 2DEG. The carrier density will increase with increasing thickness of the carrier donor layer 44, and is also a function of the composition of the carrier donor layer 44. A higher aluminum (Al) content material increases the strain and the charge density, and also limits the maximum thickness of the layer. For many applications, Al content within an AlGaN carrier donor layer can be in the range of between about 10% and about 30%, for example, about 25%. When combined with the GaN buffer layer 42, the carrier donor layer 44 functions as the donor supply layer to provide the 2DEG high conductivity layer within the buffer layer 42. As described above, the buffer layer 42 can provide a transistor channel for circuits formed over the semiconductor wafer substrate assembly.

The capping layer 46 can include one or more layers selected from GaN and AlN, and can be formed to between about 50 Å and about 250 Å thick. Forming the GaN or AlN capping layer 46 over the AlGaN or InAlN carrier donor layer can improve surface passivation and can also provide improved contacts to device structures. Suitable capping layers of GaN and/or AlN can be formed using the GaN and/or AlN processes previously described. The capping layer 46 may be undoped or doped, for example, to an N+ conductivity.

Figure 5:
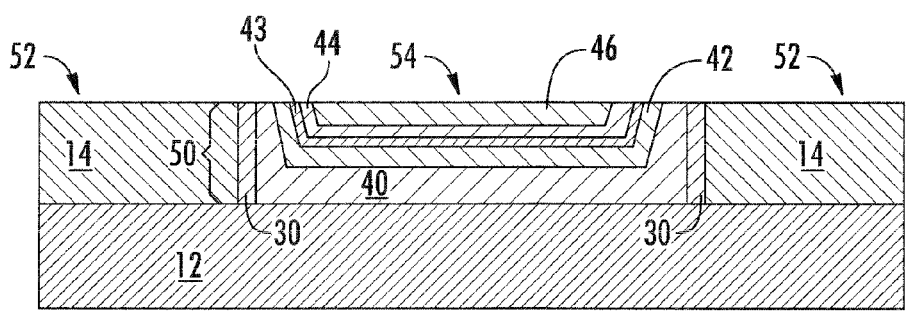

After completing a structure similar to FIG. 4, the surface of the FIG. 4 structure is planarized down to a level which removes the hard mask 16 to result in the FIG. 5 structure. Planarization can be performed using a mechanical polishing process such as a chemical mechanical polishing (CMP). An embodiment according to the present teachings such as depicted in FIG. 5 can include stress relief layer 40, GaN buffer layer 42, and carrier donor layer 44, and may include barrier layer 43 and capping layer 46. For purposes of this disclosure, these structures 40, 42, and 44, and layers 43 and 46 if present, are collectively referred to as GaN device layer and are depicted in FIG. 5 as 50, while silicon layer 14 provides a silicon device layer. The depicted GaN device layer 50 is an exemplary stack of layers 40-46, but may include less than all of these layers or may include additional layers in accordance with the present teachings, such as additional buffer layers, barrier layers, stress relief layers, isolation layers, etc. The dielectric oxide spacers 30 are interposed between the GaN device layer 50 and the silicon device layer 14 by the oxide spacers 30.

The silicon device layer 14 comprises a planarized surface 52 which is substantially coplanar with a planarized surface 54 of the GaN device layer 50. As discussed below, one or more semiconductor devices can be formed on and/or within each of the silicon device layer 14 and the GaN device layer 50, such that the planarized surfaces 52, 54 are coplanar and provide an active surface (i.e., an active area) for the semiconductor devices formed thereover. For purposes of this disclosure, surfaces or structures which are "substantially coplanar" refer to two or more surfaces or structures which lie in the same plane, have portions which lie in the same plane, or have surfaces or structures which would lie in the same plane except for processing variation, for example, resulting from dishing during a planarization process or from an intentional over-polish. The devices formed over the planarized surfaces 52, 54 can have analogous features which are themselves substantially coplanar, such as transistor gates, spacers, or other analogous conductive or dielectric materials. Coplanarity of the surfaces can be measured relative to a conventional plane or working surface of the wafer or substrate. It should be noted that the degree of coplanarity can be adjusted by the initial thickness of the silicon device layer 14, the total thickness of the GaN device layer 50, and the amount of polish. For example, if the GaN device layer 50 is thinner than the silicon device layer 14, the silicon device layer 14 can be over polished. Further, the coplanarity can be adjusted by potentially over etching (or recessing) region 22 (FIG. 2), particularly if silicon 14 is thinner than the GaN device layer 50.

Figure 6:
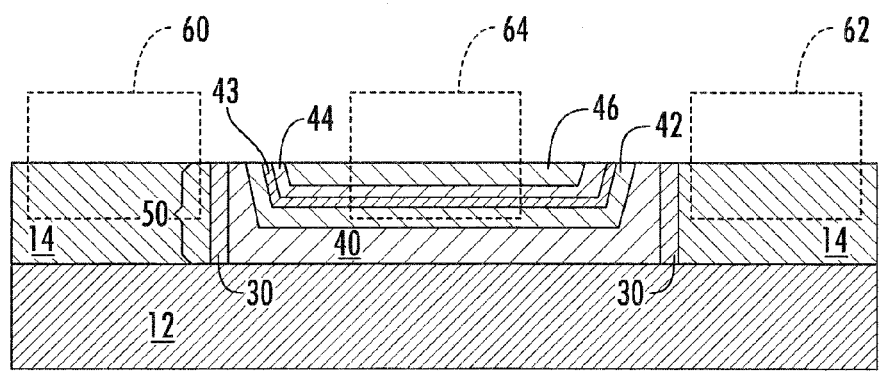

Subsequently, additional structures can be formed over and/or within the FIG. 5 structure as depicted in FIG. 6, such as various semiconductor devices and circuitry. The silicon device 14 provides a bulk silicon (i.e., silicon semiconductor functionality) for the formation of silicon-based or silicon germanium-based devices, while GaN device layer 50 provides a bulk GaN (i.e., GaN semiconductor functionality) for the formation of GaN-based devices. FIG. 6 depicts a first semiconductor device 60 and a second semiconductor device 62 which can be formed on and/or within the silicon device layer 14, and a semiconductor device 64 which can be formed on and/or within the GaN device layer 50. It will be understood that any number of devices can be formed using the silicon layer and/or GaN structure as a semiconductor substrate. As such, the devices 60, 62, and 64 are each depicted with a dashed line at one possible location which can vary with the type of device.

Semiconductor devices 60, 62, and 64 can be any desired device formed on and/or within silicon device layer 14, and GaN device layer 50. The devices 60, 62, and 64 can include, for example, devices similar to those described with reference to FIG. 31 below, or other types of devices. For example, a device such as device 60 or 62 formed on and/or within the silicon device layer can include N and P channel metal oxide semiconductor (MOS) field effect transistors (FETs), junction FETs (JFETs), bipolar transistors, resistors, gate driver circuits, power management circuits such as high side and/or low side power devices and/or controller circuitry for a voltage converter device, analog circuits, mixed-signal circuits, controller circuits, diodes, Schottky diodes, vertical double diffused MOSFETs (e.g., VDMOS), lateral double diffused MOS, insulated gate bipolar transistors (IGBT), silicon-controlled rectifiers (SCR), electrostatic discharge (ESD) structures, capacitors, resistors, etc. Further, depicted devices 60, 62 can each be a combination of circuits such as complementary MOS (CMOS) devices, two or more bipolar devices, bipolar junction transistors and CMOS devices (i.e., BiCMOS), complementary bipolar, complementary BiCMOS, etc. A device such as device 64 formed on and/or within the GaN device layer can include one or more lateral diodes, high electron mobility transistor (HEMT), metal-insulator-semiconductor field effect transistor (MISFET), metal semiconductor field effect transistor (MESFET), heterostructure FET (HFET), JFET, vertical transistors, power devices, switches, enhancement mode FETs, depletion mode FETs, insulated gate FETs, diodes, bipolar transistors, etc. Additionally, the structures can be formed over silicon device layer 14 and GaN device layer 50, such as thin film transistors (TFT). Further, bonded wafers can be attached to the FIG. 5 structure.

Devices represented by 60, 62, 64 can include regions within the semiconductor layers 14 and 50, such as doped source regions, drain regions, channel regions, contacts, etc. Devices 60, 62, and 64 can be one or more transistor gates, electrodes, contacts, interconnects, passivation layers, etc.

A device according to the present teachings can include one or more of various characteristics. For example, the device can include a semiconductor wafer substrate assembly with a GaN device layer and a silicon device layer as part of the same semiconductor die. Further, the GaN device layer can be grown, and therefore avoids a wafer bonding technique which can result in wafer warpage. The GaN device layer 50 and the silicon device layer 14 can have surfaces which lie in the same plane (i.e., are substantially coplanar), which can simplify wafer processing. Additionally, the GaN device layer 50 does not directly underlie or directly overlie the silicon device layer 14, and the silicon device layer 14 does not directly underlie or directly overlie the GaN device layer 50, when measured perpendicular to surfaces 52, 54. Thus GaN devices and circuits 64 and silicon devices and circuits 60, 62 can be monolithically integrated on a single substrate which includes a GaN device layer 50 and a silicon device layer 14. The sapphire layer 12 provides support for both the GaN device layer 50 and the silicon device layer 14, both of which physically contact the sapphire layer 12.

Another embodiment of the present teachings can include the use of selective nitride growth to provide a GaN device layer which can be used, for example, as a semiconductor bulk layer. In a process using selective nitride growth to provide a GaN device layer, a structure similar to that depicted in FIG. 3 formed, for example, using the method described with reference to FIGS. 1-3. In this embodiment, the hard mask 16 can include a top layer of silicon oxide. Subsequently, nitride-based device and circuit layers can be formed using selective growth to result in a structure similar to that depicted in FIG. 7. For purposes of illustration, the structure of FIG. 7 omits the formation of an optional barrier layer such as layer 43 in FIG. 5, but the device may also include the formation of an optional barrier layer. In contrast to the blanket growth of FIG. 4, this growth is inhibited by the silicon oxide of the mask layer 16, such that the growth occurs only within the opening between oxide spacers 30 over the sapphire wafer 12, and not over the silicon device layer 14, to result in selective nitride growth. The selective growth results in stress a relief layer 70, a buffer layer 72, a carrier donor layer 74, and an optional capping layer 76 within the opening 32, and may also include an optional binary barrier layer (not depicted) similar to layer 43 of FIG. 5 which is omitted in this embodiment for illustration.

The stress relief layer can include one or more individual layers, and provides stress relief to prevent damage to the underlying sapphire layer. In one process, alternating layers of low temperature AlN (AlN-LT), high temperature AlN (AlN-HT), GaN, and AlGaN can be used. Similar processing according to the embodiment described above with reference to FIGS. 1-6 can be used.

In one exemplary embodiment, a selective growth layer of AlN-LT is performed, followed by a selective growth of GaN. Next, a selective growth of AlGaN can be formed on the GaN layer.

After completing the stress relief layer 70 as described above, or a different stress relief layer, a selective growth of a buffer layer 72 on the stress relief layer 70 is performed. A suitable buffer layer 72 of GaN can be formed using the process described above for the stress relief layer 70 for a duration sufficient to form a GaN layer.

Next, a carrier donor layer 74 can be selectively grown on the GaN buffer layer 72. A suitable carrier donor layer can include an AlGaN layer or an InAlN layer between about 100 Å and about 400 Å, and can be formed using the processes described above for the selective growth of the stress relief layer.

Subsequently, a selective growth of an optional capping layer 76 can be performed. The capping layer 76 can include an AlN or GaN layer formed, for example, using a process as described above, or a technique known in the art.

Figure 7:
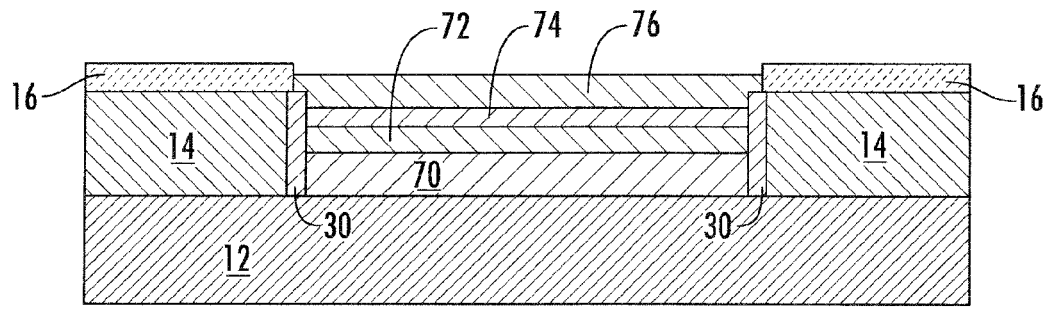
FIGS. 7-9 are cross sections of intermediate structures of an in-process device in accordance with another embodiment of the present teachings.

Once the stress relief layer 70, the buffer layer 72 and the carrier donor layer 74 and, optionally, either or both of a binary barrier layer and the capping layer 76 is completed, a structure similar to that of FIG. 7 remains.

Subsequently, the surface of the FIG. 7 structure is planarized to remove the hard mask layer 16 and to result in the structure of FIG. 8. For purposes of this disclosure, the selectively grown layers are referred to collectively herein as GaN device layer 80, while silicon device layer 14 provides a silicon device layer. For this exemplary process, the GaN device layer 80 includes layers 70, 72, 74, and 76. The GaN device layer 80 can be electrically isolated from silicon device layer 14 through the oxide spacers 30. In this process, a hard mask 16 includes a top silicon oxide layer such as silicon dioxide rather than a silicon nitride layer of the embodiment previously described. GaN device layer 80 does not form on a silicon dioxide surface such that hard mask 16 inhibits the growth of a GaN layer.

Figure 8:
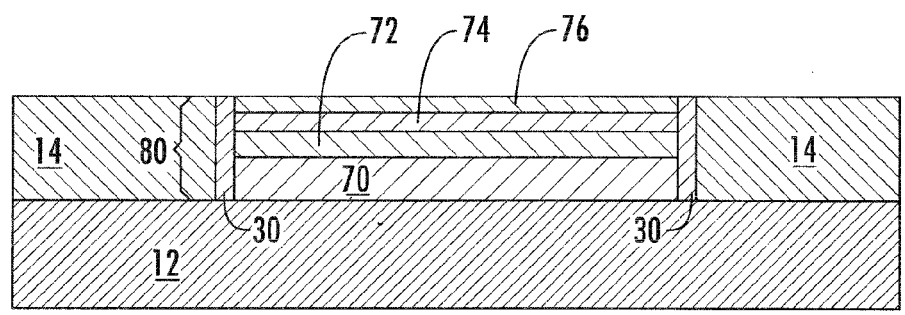
Figure 9:
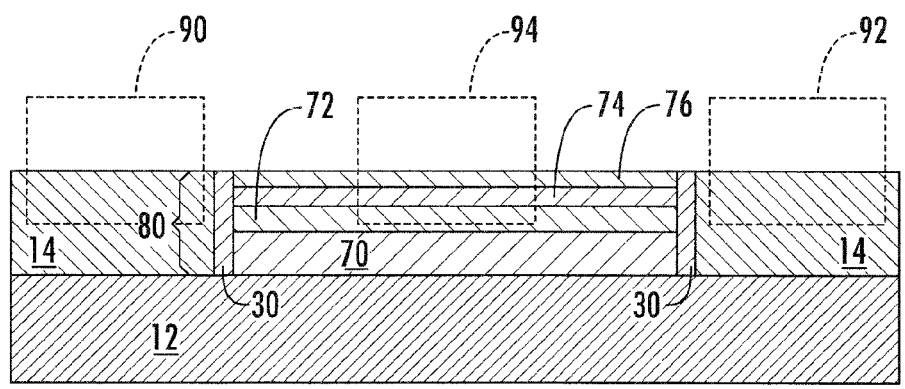

Next, additional structures can be formed over and/or within the FIG. 8 structure as depicted in FIG. 9, such as various semiconductor devices and circuitry. The silicon device layer 14 provides a bulk silicon (i.e., silicon semiconductor functionality), while GaN device layer 80 provides a bulk GaN (i.e., GaN semiconductor functionality). FIG. 9 depicts a first semiconductor device 90 and a second semiconductor device 92 which can be formed on and/or within the silicon device layer 14, and a semiconductor device 94 which can be formed on and/or within the GaN device layer 80. It will be understood that any number of devices can be formed using the silicon layer and/or GaN structure as a semiconductor substrate, such as those described with reference to FIG. 6. As such, the devices 90, 92, and 94 are each depicted with a dashed line at one possible location which can vary with the type of device.

Semiconductor devices 90, 92, and 94 can be any desired device formed on and/or within silicon device layer 14, and GaN device layer 80. The devices 90, 92, and 94 can include, for example, devices similar to those described with reference to FIG. 31 below, or other types of devices. For example, a device such as device 90 or 92 can include devices described in reference to devices 60, 62 with reference to FIG. 6. Additionally, the structures can be formed over silicon device layer 14 and GaN device layer 80, such as thin film transistors (TFT). Further, bonded wafers can be attached to the FIG. 8 structure.

Devices represented by 90, 92, 94 can include regions within the semiconductor layers 14 and 80, such as doped source regions, drain regions, channel regions, contacts, etc. Devices 90, 92, and 94 can be one or more transistor gates, electrodes, contacts, interconnects, passivation layers, etc.

Figure 10:
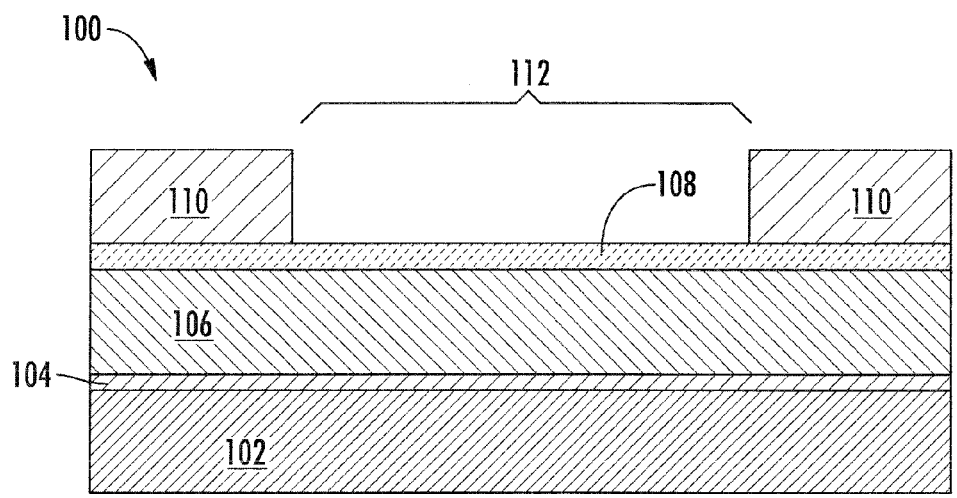
FIGS. 10-16 are cross sections of intermediate structures of an in-process device in accordance with another embodiment of the present teachings.

Another embodiment of the present teachings can include the use of a silicon handle wafer as a substrate and conformal blanket growth of nitride device layers on the silicon handle wafer. An exemplary starting structure 100 is depicted in FIG. 10, and can include a silicon handle wafer 102, for example, having a <111> crystal orientation, a buried oxide layer 104, and a silicon layer 106, for example, having a <100> crystal orientation. A handle wafer 102 having a <111> crystal orientation will provide for sufficient subsequent nitride device layer formation. The buried oxide layer 104, which can be silicon dioxide ($SiO_2$) formed from oxidation of the silicon handle wafer 102, can be between about 1 KÅ to about 25 KÅ thick.

Next, a hard mask layer 108 is formed over the surface of the silicon layer 106 in accordance with the embodiments described above. The hard mask layer can include oxide, nitride, or both, and can be formed using thermal oxidation, chemical vapor deposition (CVD), a pad oxide formation, or a combination. Multiple oxide and/or nitride layers may be formed. For this embodiment, the hard mask 108 includes an exposed upper layer of silicon nitride such that GaN layers will form on the hard mask to overlie silicon layer 106. To complete the FIG. 10 structure, a patterned resist layer 110 is formed, for example, using conventional photolithographic techniques. An opening 112 within the resist will expose portions of the hard mask 108 and silicon layer 106, and will define a width of a subsequently formed GaN device layer. The width of opening 112 within resist 110 will depend on the device being formed.

Figure 11:
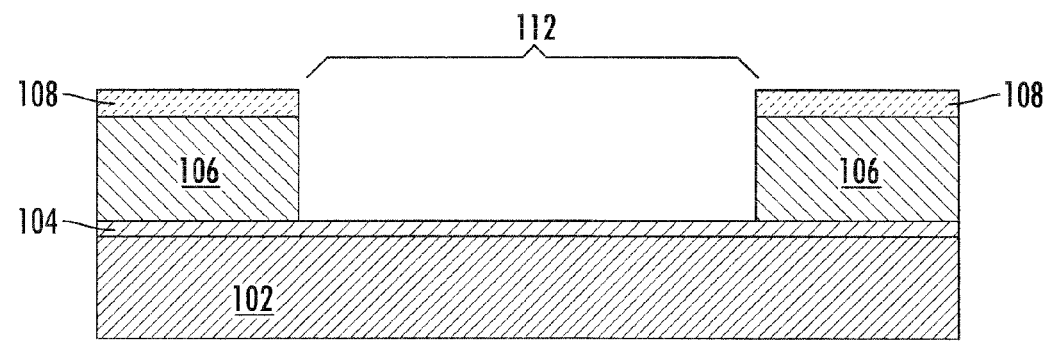

Next, the exposed hard mask 108 and exposed silicon layer 106 are etched selective to the buried oxide layer 104, and the resist 110 is removed (stripped) to result in a structure similar to FIG. 11. A first etch can be used to etch the hard mask 108, and a second etch can be used to etch the silicon layer 106 and stop on the buried oxide layer 104. Nitride, oxide, and silicon etches are known in the art. The resist 110 can be removed (stripped) after etching the hard mask 108, or after etching both the hard mask 108 and the silicon layer 106.

Figure 12:
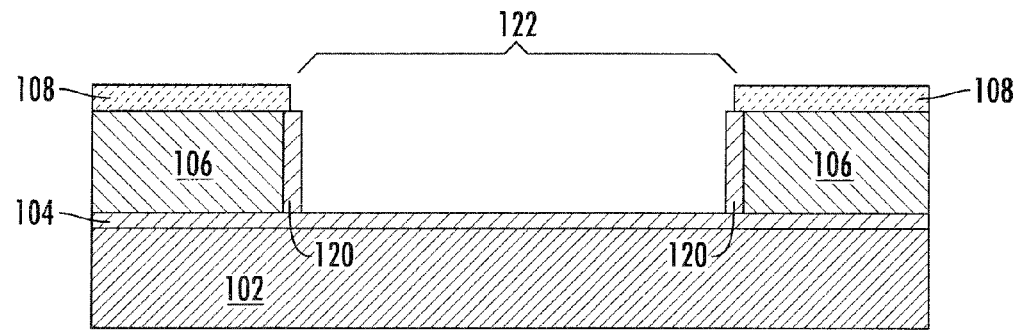

Subsequently, an unpatterned thermal oxidation of the FIG. 11 structure can be performed to result in the FIG. 12 structure. The thermal oxidation process oxidizes the exposed silicon layer 106 to form oxide spacers 120. The thermal oxidation process used to form oxide 120 can also densify the hard mask layer 108 so that it is more resistant to an etch.

Figure 13:
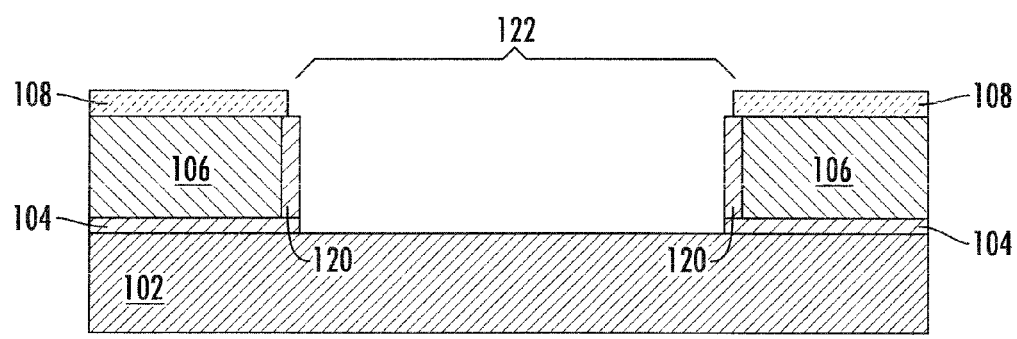

Subsequently, an anisotropic oxide etch is performed to remove the exposed buried oxide 104 at the bottom of opening 122 to result in the FIG. 13 structure. The removal of exposed oxide can include a reactive ion etch of exposed oxide 104 selective to <111> silicon layer 102. The etch exposes a surface of the <111> silicon layer 102 at the opening 122.

After exposing the silicon layer 102, various blanket conformal layers are formed to provide nitride-based device and circuit layers. These layers can include a stress relief layer 140, a buffer layer 142, a carrier donor layer 144, and a capping layer 146. These layers 140-146 can be formed in accordance with the embodiment described above, for example, in reference to FIG. 4, and may include an optional binary barrier layer similar to layer 43 depicted and described with reference to FIG. 5. The various steps to form these layers are not repeated for brevity.

Figure 14:
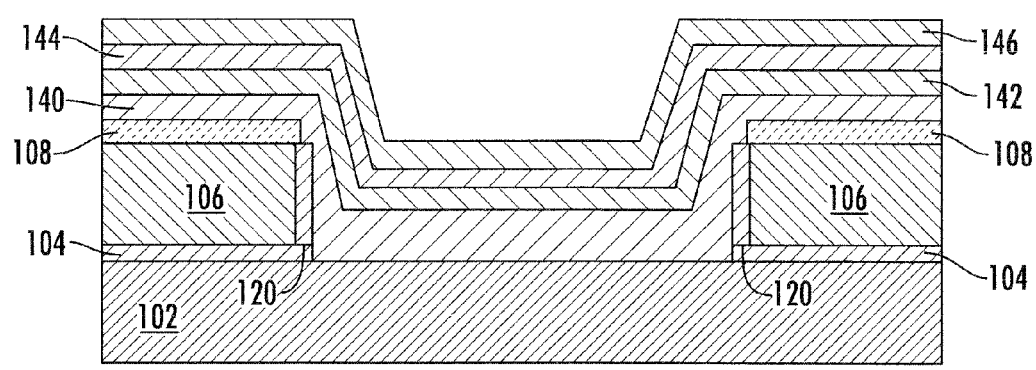
Figure 15:
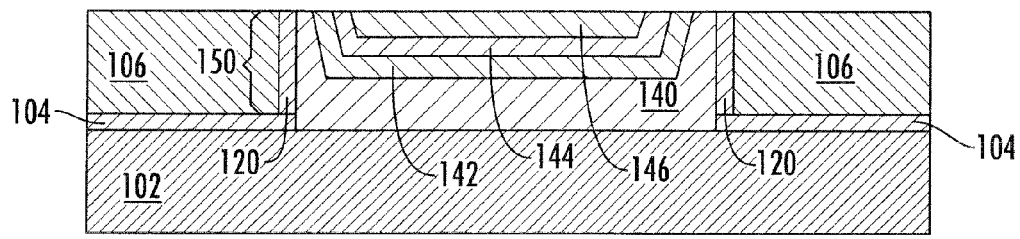

After forming the FIG. 14 structure, a planarization process is performed to result in the FIG. 15 structure. The planarization process can remove layers 108 and 140-146 to form a planar surface which includes silicon layer 106, oxide spacers 120, stress relief layer 140, buffer layer 142, carrier donor layer 144, and capping layer 146 as depicted. For purposes of this disclosure, these structures 140, 142, 144, and 146 are collectively referred to as the "GaN device layer" and are depicted in FIG. 15 as 150, while silicon layer 106 provides a silicon device layer. The GaN device layer 150 can be electrically isolated from the silicon layer 106 by the oxide spacers 120. The depicted GaN device layer 150 is an exemplary stack of layers 140-146, but may include less than all of these layers or may include additional layers in accordance with the present teachings, such as additional buffer layers, one or more barrier layers, stress relief layers, isolation layers, etc.

Figure 16:
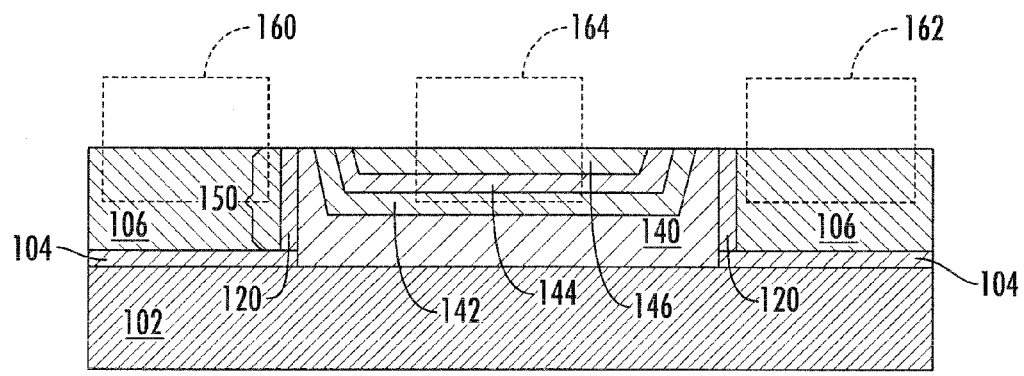

Subsequently, additional structures can be formed over and/or within the FIG. 15 structure as depicted in FIG. 16, such as various semiconductor devices and circuitry. The silicon layer 106 provides a bulk silicon (i.e., silicon semiconductor functionality), while GaN device layer 150 provides a bulk GaN (i.e., GaN semiconductor functionality). FIG. 16 depicts a first semiconductor device 160 and a second semiconductor device 162 which can be formed on and/or within the silicon layer 106, and a semiconductor device 164 which can be formed on and/or within the GaN device layer 150. It will be understood that any number of devices can be formed using the silicon layer and/or GaN structure as a semiconductor substrate. As such, the devices 160, 162, and 164 are each depicted with a dashed line at one possible location which can vary with the type of device. These devices can be formed as discussed relative to FIG. 6, for example, and are not discussed here for brevity.

Figure 17:
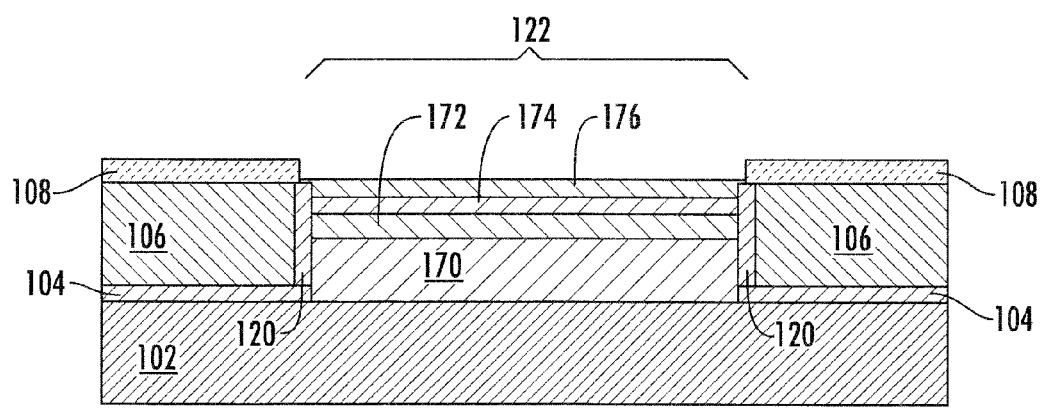
FIGS. 17-19 are cross sections of intermediate structures of an in-process device in accordance with another embodiment of the present teachings.

Another embodiment of the present teachings can include the use of a silicon handle wafer and selective growth of nitride device layers on and over the silicon handle wafer. An embodiment can begin with the formation of a structure similar to that depicted in FIG. 13, including a <111> silicon handle wafer 102 which is exposed at opening 122. Additionally, hard mask 108 will include an upper layer of silicon oxide, such as silicon dioxide, to inhibit the growth of GaN layers over the hard mask and the selective growth of GaN layers within the opening 122. Next, various layers can be selectively grown within the opening 122 as depicted in FIG. 17. These layers can include a stress relief layer 170, a buffer layer 172, a carrier donor layer 174, and an optional capping layer 176. These layers can be formed in accordance with the techniques discussed relative to FIG. 9, for example, and may include a binary barrier layer. The methods used to form these structures are not repeated here for brevity.

Figure 18:
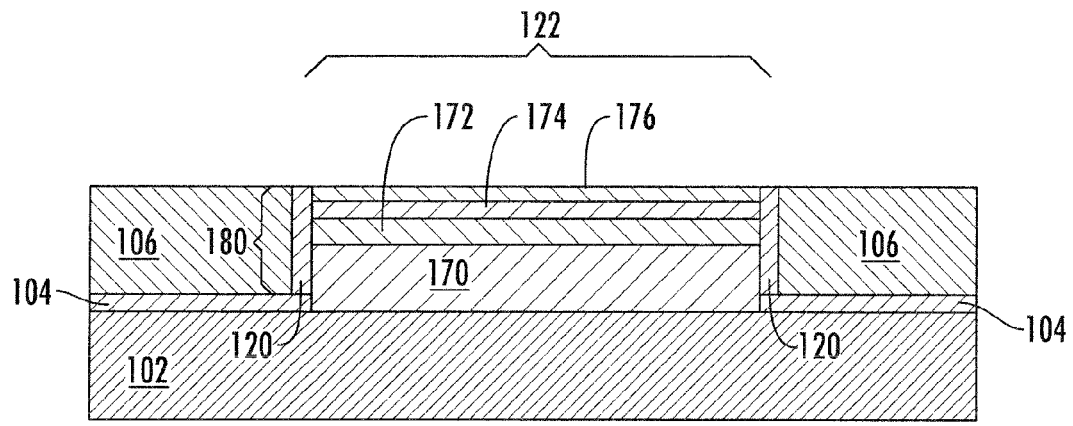

After forming a structure similar to FIG. 17, the surface of the structure is planarized to remove the hard mask layer 108 and a portion of the capping layer 176 to result in a structure similar to that depicted in FIG. 18. An upper surface of the FIG. 18 structure includes a <100> silicon layer 106, a capping layer 176 which can include AlGaN and/or InAlN, as well as oxide spacers 120. The oxide spacers can electrically isolate the silicon layer 106 from layers 170-176, which are collectively referred to herein as GaN device layer 180, while silicon layer 106 provides a silicon device layer.

Figure 19:
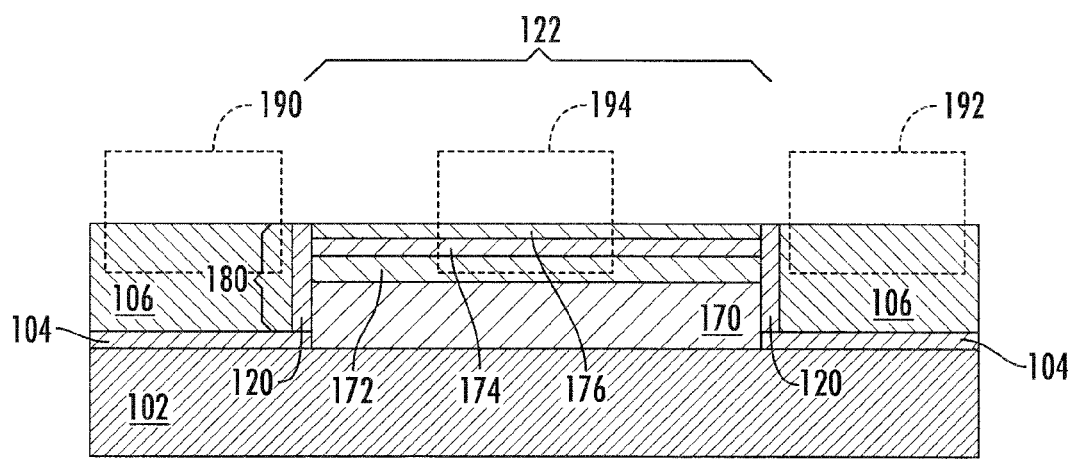

After forming the FIG. 18 structure, one or more semiconductor devices 190, 192 can be formed on and/or within the silicon device layer 106, and one or more semiconductor devices 194 can be formed on and/or within the GaN device layer 180 as depicted in FIG. 19. These devices 190-194 can be similar to devices 60-64 discussed relative to FIG. 6, and are not discussed here for brevity.

Another embodiment of the present teachings can include silicon to silicon (SS) direct bonding. An embodiment can begin with a structure 200 similar to that depicted in FIG. 20, which can include a <111> silicon handle wafer 202, a <100> silicon layer 204, a hard mask layer 206 having an upper exposed surface of silicon nitride, and a patterned resist mask 208 having an opening therein 210. The silicon layer 204 can be attached to the silicon handle wafer 202, for example, through a wafer bonding process in accordance with known techniques; such techniques can include placement of two wafers in contact with each other and an anneal, using the van der Waals force effect. A width of opening 210 will define a width of a GaN device layer which is subsequently formed.

Figure 20:
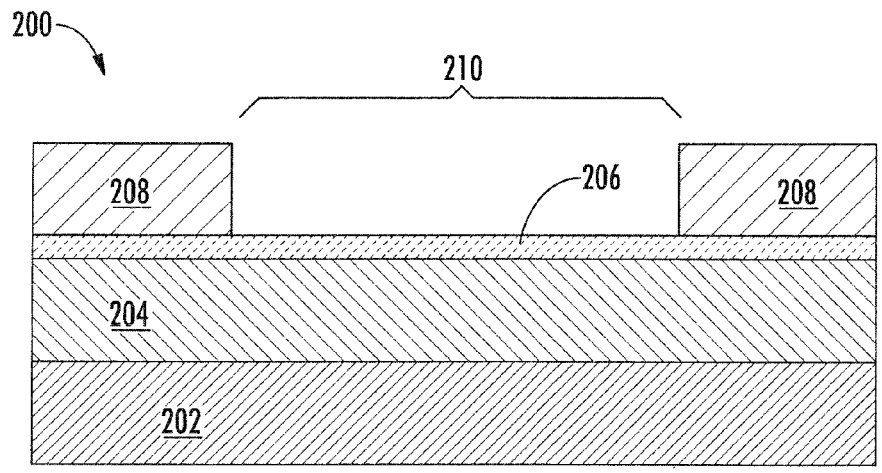
FIGS. 20-26 are cross sections of intermediate structures of an in-process device in accordance with another embodiment of the present teachings.
Figure 21:
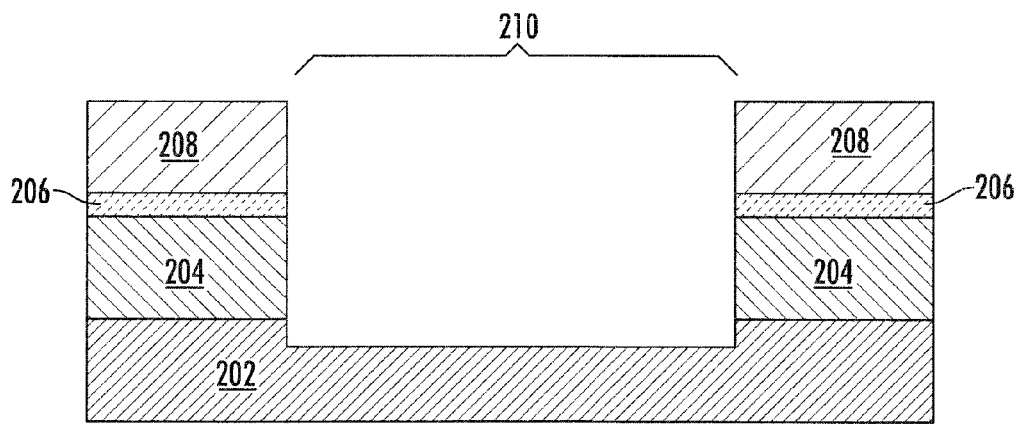

After forming the FIG. 20 structure, one or more etches are performed through opening 210 to etch through the hard mask layer 206, the silicon layer 204, and partially into the <111> silicon handle wafer 202 to result in the structure of FIG. 21.

Figure 22:
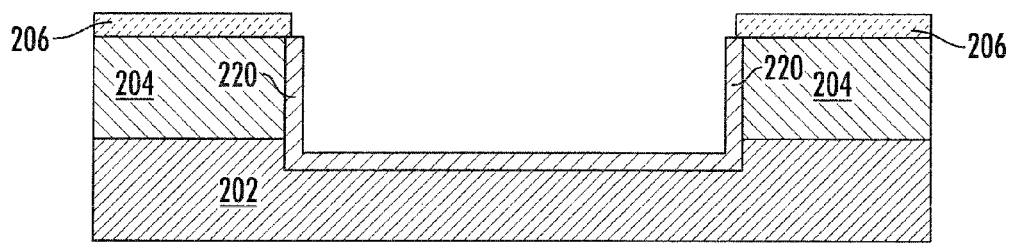

Next, exposed silicon surfaces are oxidized, for example, using a thermal oxidation process to result in oxide layer 220 as depicted in FIG. 22. This process oxidizes the exposed silicon surfaces of both the silicon handle wafer 202 and the silicon layer 204.

Figure 23:
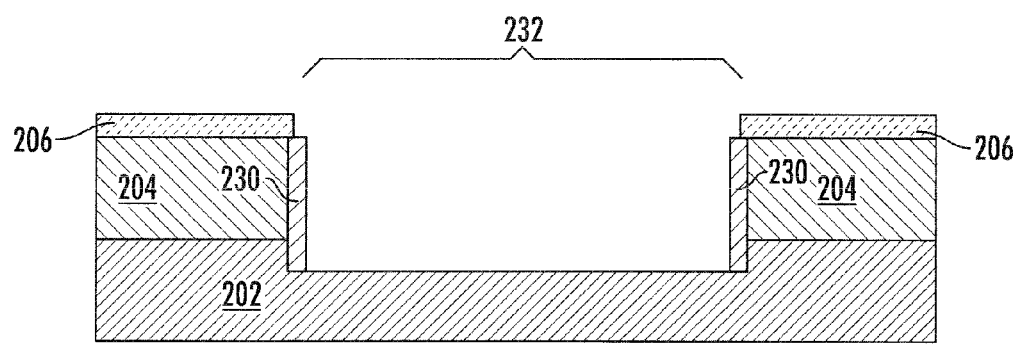

Next, an anisotropic spacer etch of oxide layer 220 is performed result in the structure of FIG. 23, which includes oxide spacers 230, and an opening 232. This spacer etch removes a majority of oxide layer 220 from the silicon handle wafer 202.

In various embodiments of the present teachings, oxide spacers 230 may be omitted in some applications, for example, to reduce the number of processing steps. This would be applicable, for example, in devices where electrical isolation is not required between a subsequently formed GaN device layer and either of the silicon handle wafer 202 or the silicon layer 204.

Figure 24:
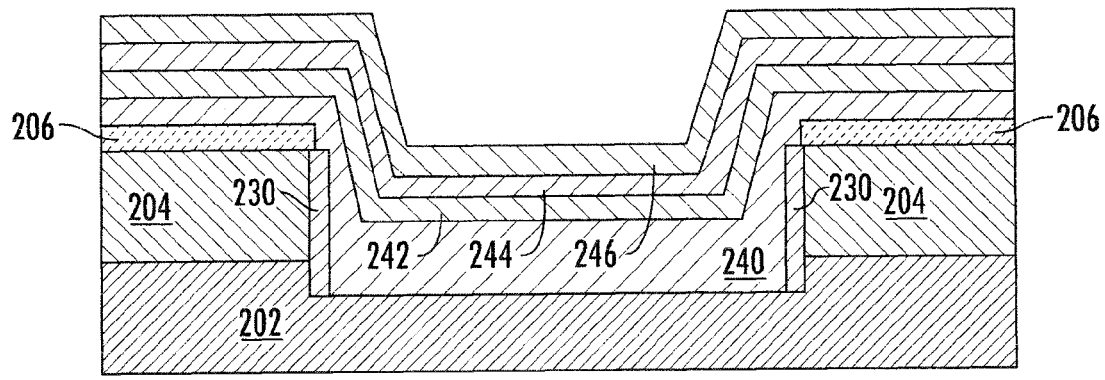

Next, various conformal blanket layers which can include a stress relief layer 240, a buffer layer 242, an optional barrier layer 244, and a capping layer 246 can be formed as depicted in FIG. 24. These layers can be formed using the techniques in accordance with the embodiment of FIG. 4, and are not repeated here for brevity.

Figure 25:
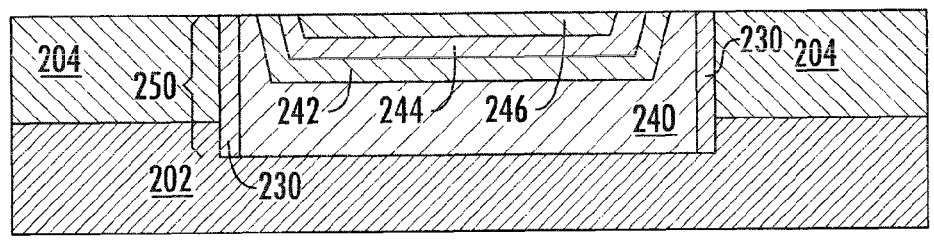

Next, the FIG. 24 structure is planarized, for example, using a CMP process, to result in the structure of FIG. 25. FIG. 25 includes a planarized surface including <100> silicon layer 204, stress relief layer 240, buffer layer 242, optional barrier layer 244, and capping layer 246, as well as spacers 220. Layers 240-246 are referred to herein collectively as GaN device layer 250, while silicon layer 204 provides a silicon device layer. The GaN device layer 250 can be electrically isolated from the silicon layer 204 by spacers 220.

As depicted in FIG. 25, GaN device layer 250 and silicon device layer 204 overlie and are in direct contact with (i.e., physically contact) the silicon handle wafer 202. As such, both layers will be electrically connected to the silicon handle wafer 202 either resistively (when the overlying layer and the silicon handle wafer are doped to the same type, e.g., N type) or through a diode (when doping of the silicon handle wafer 202 and the overlying layer are doped to opposite conductivities, N type and P type). Junction isolation between the gallium nitride device layer 250 and the silicon device layer 204 can be achieved, for example, using a silicon handle wafer 202 doped to a concentration of net P type conductivity connected to ground while both overlying GaN device layer 240 and overlying silicon layer 204 are doped to a concentration of net N type conductivity. Bias voltages applied to the silicon handle wafer 202, the silicon device layer 204, and the gallium nitride device layer 250, as well as the dopant types and concentrations of these layers, can be selected to provide junction isolation between the silicon device layer 204 and the gallium nitride device layer 250 during device operation. Other junction isolation schemes that isolate silicon layer 204 from GaN layer 240 are also possible.

Figure 26:
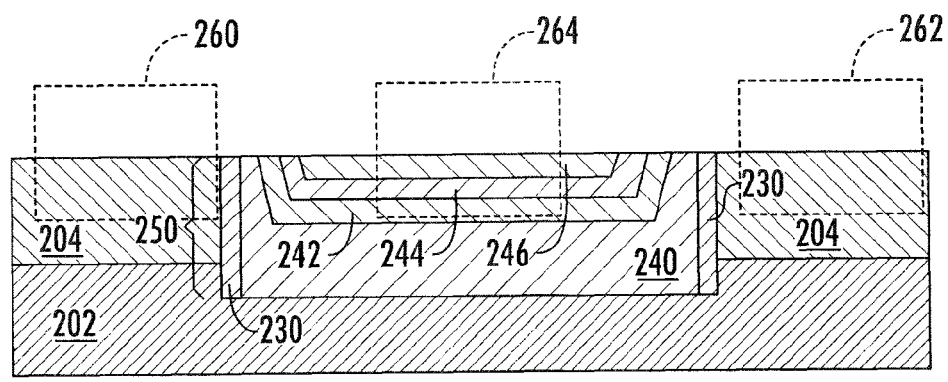

Subsequently, one or more semiconductor devices 260, 262 can be formed over the silicon layer 204, and one or more semiconductor devices 264 can be formed over the GaN device layer 250 as depicted in FIG. 26. These devices 260-264 can be similar to devices 60-64 discussed relative to FIG. 6, and are not discussed here for brevity.

Another embodiment of the present teachings can include selective formation of various layers over a silicon handle wafer. An embodiment can start with the structure of FIG. 22, which can be formed in accordance with the techniques discussed relative to FIGS. 19-22 using a silicon oxide hard mask 206 to inhibit the formation of a GaN layer over the silicon layer 204, and are not repeated for brevity.

Figure 27:
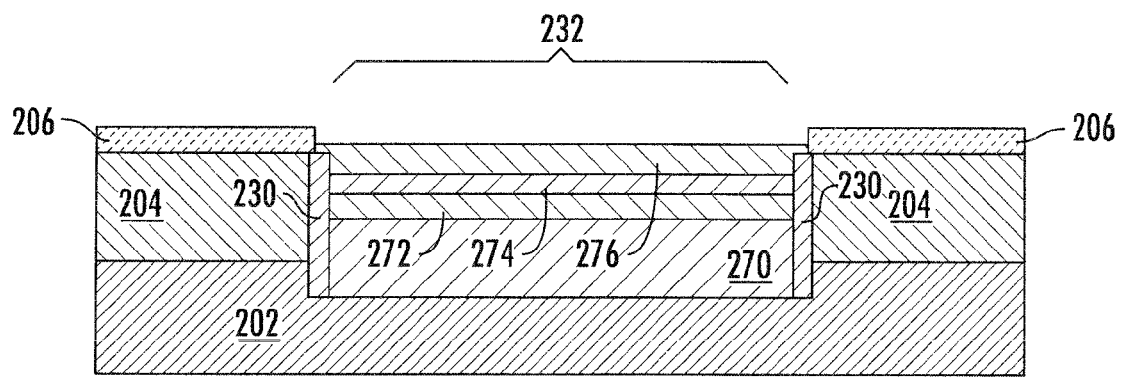
FIGS. 27-29 are cross sections of intermediate structures of an in-process device in accordance with another embodiment of the present teachings.

After forming a structure similar to FIG. 23, a selective formation of various layers is performed within opening 232 to result in a structure similar to that depicted in FIG. 27. The various layers can include a stress relief layer 270, a buffer layer 272, an optional barrier layer 274, and a capping layer 276. These layers can be formed in accordance with the techniques discussed relative to FIG. 7.

Figure 28:
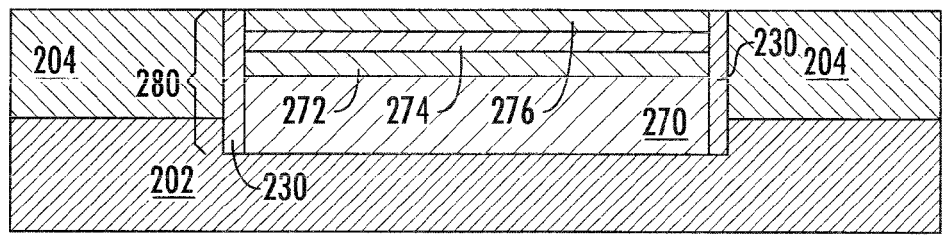
Figure 29:
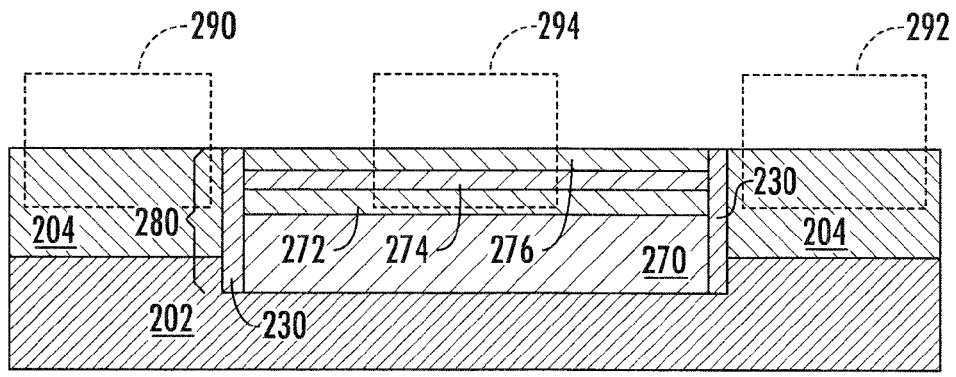

After forming the FIG. 27 structure, a planarization process such as CMP is performed to result in the FIG. 28 structure. Layers 270-276 are collectively referred to herein as GaN device layer 280 while silicon layer 204 provides a silicon device layer. An upper surface of structure 282 includes silicon layer 204, capping layer 276, and oxide spacers 220.

After forming the FIG. 28 structure, one or more semiconductor devices 290, 292 can be formed on and/or within the silicon device layer 204, and one or more semiconductor devices 294 can be formed on and/or within the GaN device layer 280. These devices 290-294 can be similar to devices 60-64 discussed relative to FIG. 6, and are not discussed here for brevity.

A device according to the present teaching can include one or more of various characteristics. For example, the device can include a semiconductor wafer substrate assembly with a GaN device layer and a silicon device layer as part of the same semiconductor die. Further, the GaN device layer can be grown, and therefore avoids a wafer bonding technique which can result in wafer warpage. The GaN device layer and the silicon device layer can have surfaces which lie in the same plane (i.e., are substantially coplanar), which can simplify wafer processing. Additionally, the GaN device layer does not underlie or overlie the silicon device layer, and the silicon device layer does not underlie or overlie the GaN device layer. Thus GaN devices and circuits and silicon devices and circuits can be monolithically integrated on a single substrate which includes a GaN device layer and a silicon device layer to form integrated circuits.

In some embodiments, a sapphire layer provides support for both a GaN device layer and a silicon device layer, both of which can physically contact the sapphire layer. In other embodiments, a silicon handle layer provides support for both a GaN device layer and a silicon device layer, both of which can physically contact the silicon handle wafer.

The GaN device layer can either be selectively grown over a <0001> sapphire wafer or a <111> silicon handle wafer using a silicon oxide hard mask, or grown using a conformal blanket formation using a silicon nitride hard mask. Both a <0001> sapphire layer and a <111> silicon layer allow a high-quality growth of a GaN device layer. In described embodiments, no bonding is performed on the structures after nitride layer growth, which avoids wafer warpage which can occur when bonding is performed after nitride layer growth.

Figure 30:
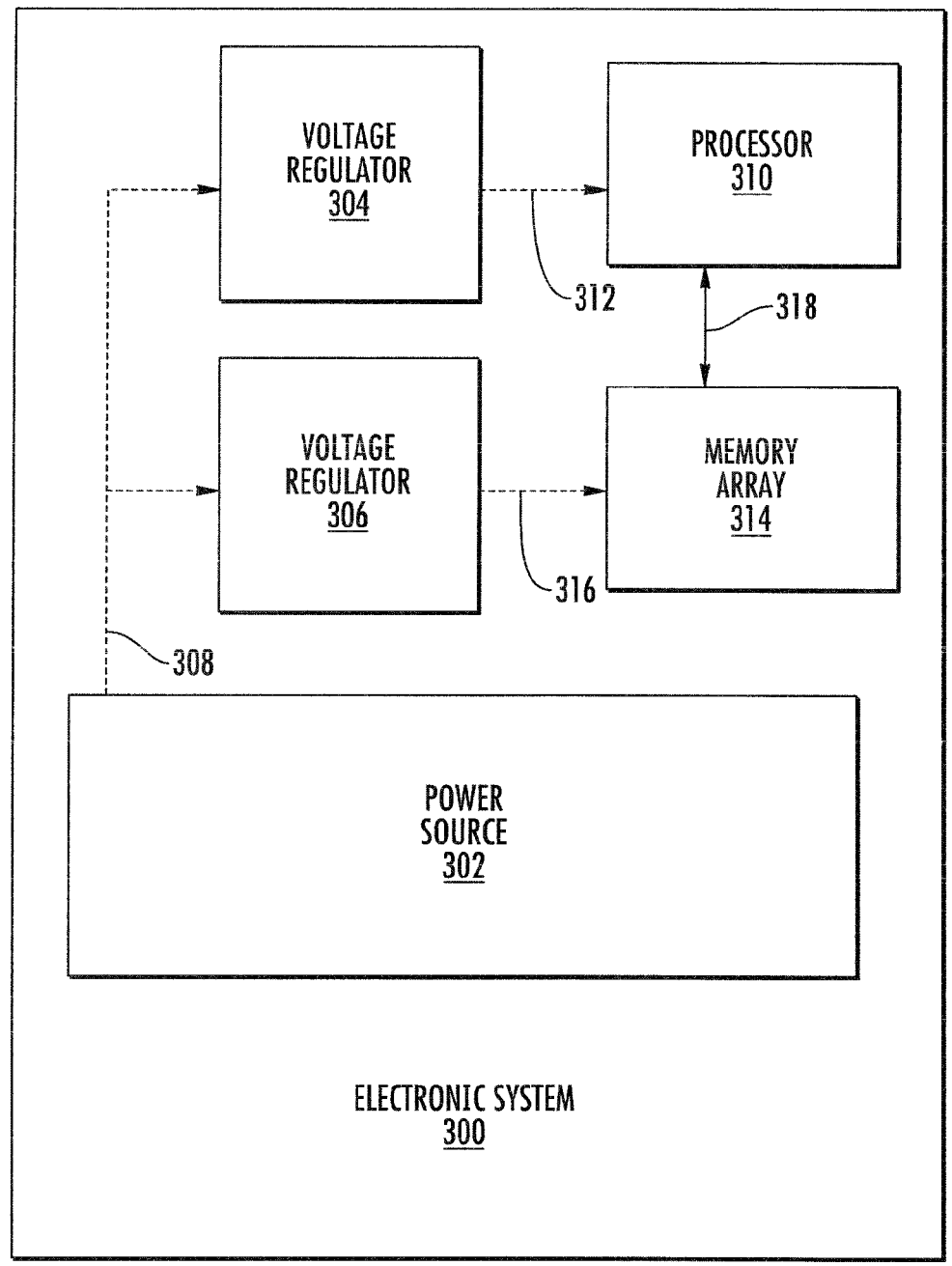
FIG. 30 is a block diagram depicting an electronic system in accordance with an embodiment of the present teachings.

A semiconductor device as described above may be attached along with other semiconductor devices such as one or more microprocessors to a printed circuit board, for example, to a computer motherboard, for use as part of an electronic system such as a personal computer, a minicomputer, a mainframe, or another electronic system. A particular embodiment of an electronic system 300 according to the present teachings is depicted in the block diagram of FIG. 30. The electronic system 300 can include a power source (power supply) 302 which is electrically coupled to one or more voltage regulators (voltage convertors) 304, 306 through a first power bus 308. The power source 302 may be a converted AC power source or a DC power source such as a DC power supply or battery. The electronic system can further include a circuit die such as a processor 310 which may be one or more of a microprocessor, microcontroller, embedded processor, digital signal processor, or a combination of two or more of the foregoing. The processor 310 can be electrically coupled to the first voltage regulator 304 through a second power bus 312. In this embodiment, the first voltage regulator 304 is adapted to convert power received from the power source 302 through the first power bus 308 and supply the converted power to the processor 310 through the second power bus 312. The electronic system 300 can further include a memory array 314 such as at least one memory device. The at least one memory device can include one or more static random access memory, dynamic random access memory, read only memory, flash memory, or a combination of two or more of the foregoing. The memory array can be electrically coupled to the second voltage regulator 306 through a third power bus 316. In this embodiment, the second voltage regulator is adapted to convert power received from the power source 302 through the first power bus 308 and supply the converted power to the memory array 314 through the third power bus 316. The processor can be electrically coupled to the memory array through a data bus 318. Any or all of the depicted devices, i.e., the power source 302, the first voltage regulator 304, the second voltage regulator 306, the processor 310, and the one or more memory devices in the memory array 314 can include a GaN device layer and a silicon device layer in accordance with the teachings discussed above. Electronic system 300 may be a device related to telecommunications, the automobile industry, semiconductor test and manufacturing equipment, consumer electronics, or virtually any piece of consumer or industrial electronic equipment.

Figure 31:
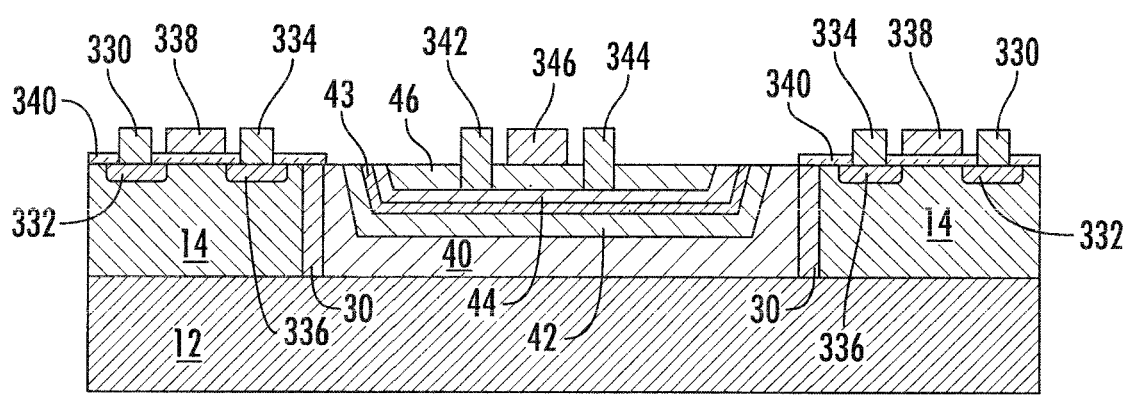
FIG. 31 is a cross section of a device in accordance with an embodiment of the present teachings having a silicon-based device on and within a silicon device layer and a nitride-based device on and within a gallium nitride device layer.

FIG. 31 depicts an embodiment of the present teachings having transistors formed on and within a substrate. The structure of FIG. 31 can include the structure of FIG. 5, along with a silicon-based MOSFET transistor over each of the depicted silicon layers 14, and with a nitride-based HEMT transistor over the GaN device layer. The transistors can be formed according to known techniques. The transistors are exemplary, as any number of transistor or other device types can be formed, for example, the devices described with reference to elements 60, 62, and 64 of FIG. 6. Each MOSFET transistor includes a transistor source metal 330 contacting a first N-well 332 and a transistor drain metal 334 contacting a second N-well 336. A MOSFET gate 338 is electrically isolated from the silicon device layer 14 with a gate dielectric 340. The HEMT transistor includes a source metal 342 and a drain metal 344 each contacting the carrier donor layer 44, and a HEMT gate 346 contacting the GaN capping layer 46. The source metal and drain metal of the HEMT transistor and the MOSFET transistors can be formed using the same patterned layer and can include one or more of aluminum, titanium, nickel, and gold.

During formation, the HEMT source metal 342 and drain metal 344 can diffuse into the carrier donor layer 44 and, if used, the binary barrier layer 43 to make electrical contact with the buffer layer 42. For an aluminum HEMT source and drain, heating the aluminum to 800° C. or above can result in a reaction with the carrier donor layer 44 and the binary layer 43 to result in electrical contact with the buffer layer 42. In various embodiments, the aluminum can be heated to between about 300° C. and about 800° C. or higher, particularly when the aluminum does not contact silicon. When the aluminum contacts silicon, heating can be limited to about 300° C. or below, which is below the eutectic temperature of aluminum-silicon.

As depicted in FIG. 31, the silicon-based semiconductor devices are substantially coplanar with the nitride-based semiconductor device. For example, the source metal 330, MOSFET gates 338, and drain metal 334 of the silicon-based devices are substantially coplanar with the source metal 342, HEMT gate 346, and drain metal 344 of the nitride-based device.

As further depicted in FIG. 31, the buffer layer 42 physically contacts the stress relief layer 40, the binary barrier layer 43 physically contacts the buffer layer, the carrier donor layer 44 physically contacts the binary barrier layer 43, and the capping layer 46 physically contacts the carrier donor layer 44.

Notwithstanding that the numerical ranges and parameters setting forth the broad scope of the present teachings are approximations, the numerical value set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g., —1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising," The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. An integrated semiconductor structure, comprising:
   a substrate;
   a silicon device layer overlying the substrate and having an active surface;
   a gallium nitride device layer overlying the substrate and having an active surface,
   wherein the active surface of the silicon device layer and the active surface of the gallium nitride device layer are substantially coplanar;
   at least one silicon-based semiconductor device formed on the active surface of the silicon device layer or formed within the silicon device layer; and
   at least one nitride-based semiconductor device formed on the active surface of the gallium nitride device layer or formed within the gallium nitride device layer.

2. The integrated semiconductor structure of claim 1, wherein the at least one silicon-based semiconductor device is substantially coplanar with the at least one nitride-based semiconductor device.

3. The integrated semiconductor structure of claim 1, further comprising:
   the silicon device layer does not directly underlie the gallium nitride device layer; and
   the gallium nitride device layer does not directly underlie the silicon device layer.

4. The integrated semiconductor structure of claim 1, wherein the gallium nitride device layer comprises:
   a stress relief layer comprising at least one of aluminum nitride, aluminum gallium nitride, and gallium nitride; and
   a buffer layer comprising a gallium nitride layer which physically contacts the stress relief layer.

5. The integrated semiconductor structure of claim 1, wherein the substrate comprises a sapphire layer.

6. The integrated semiconductor structure of claim 1, further comprising:
   the silicon device layer comprises a silicon layer having a first crystal orientation; and
   the substrate comprises a silicon layer having a second crystal orientation which is different from the first crystal orientation.

7. The integrated semiconductor structure of claim 1, further comprising:
   a dielectric layer interposed between the silicon device layer and the gallium nitride device layer which electrically isolates the silicon device layer from the gallium nitride device layer.

8. The integrated semiconductor structure of claim 4, further comprising a carrier donor layer overlying the stress relief layer and the buffer layer and the carrier donor layer comprising at least one of aluminum gallium nitride or indium aluminum nitride.

9. The integrated semiconductor structure of claim 8, wherein the carrier donor layer physically contacts the buffer layer.

10. The integrated semiconductor structure of claim 8, wherein the gallium nitride device layer further comprises at least one of:
    an aluminum nitride binary barrier layer which physically contacts the buffer layer comprising a gallium nitride layer, wherein the carrier donor layer physically contacts the aluminum nitride binary barrier layer; and a capping layer comprising at least one of gallium nitride and aluminum nitride, wherein the capping layer physically contacts the carrier donor layer.

11. The integrated semiconductor structure of claim 5, wherein a surface of the sapphire substrate is a cubic plane (C-plane).

12. The integrated semiconductor structure of claim 6, further comprising:
the first crystal orientation is <100>; and
the second crystal orientation is <111>.

13. The integrated semiconductor structure of claim 6, wherein a portion of the gallium nitride device layer and a portion of the silicon device layer physically contact the silicon layer of the substrate.

14. The integrated semiconductor structure of claim 12, further comprising:
an oxide layer interposed between the silicon layer of the substrate and the silicon layer of the silicon device layer.

15. The integrated semiconductor structure of claim 13, further comprising:
the portion of the gallium nitride device layer which physically contacts the silicon layer of the substrate has a first dopant concentration;
the portion of the silicon device layer which physically contacts the silicon layer of the substrate has a second dopant concentration;
the portion of the silicon layer of the substrate which is physically contacted by the gallium nitride device layer has a third dopant concentration; and
the portion of the silicon layer of the substrate which is physically contacted by the silicon device layer has a fourth dopant concentration,
wherein bias voltages applied to, and the dopant concentrations of, the gallium nitride device layer, the silicon device layer, and the substrate are adapted to provide junction isolation between the silicon device layer and the gallium nitride device layer during operation of the integrated semiconductor structure.

16. The integrated semiconductor structure of claim 7, wherein the dielectric layer is an oxide spacer.

17. A method of manufacturing an integrated semiconductor structure, comprising:
forming a silicon layer over a substrate;
forming a hard mask over the silicon layer;
patterning the hard mask to form an opening within the hard mask;
patterning the silicon layer to form an opening within the silicon layer and to define a silicon device layer;
forming a gallium nitride device layer at least within the opening in the silicon layer;
planarizing the gallium nitride device layer and the hard mask to expose the silicon device layer,
wherein an active surface of the silicon device layer is substantially coplanar with an active surface of the planarized gallium nitride device layer;
forming at least one silicon-based semiconductor device the active surface of the silicon device layer or within the silicon device layer; and
forming at least one nitride-based semiconductor device the active surface of the gallium nitride device layer or within the gallium nitride device layer.

18. The method of claim 17, further comprising:
subsequent to patterning the silicon layer, forming a spacer on the silicon layer, wherein the spacer electrically isolates the silicon device layer from the gallium nitride device layer.

19. The method of claim 17, wherein forming the silicon layer over the substrate comprises forming the silicon layer over a sapphire wafer.

20. The method of claim 17, wherein forming the silicon layer over the substrate comprises forming the silicon layer over a silicon wafer.

21. The method of claim 17, wherein:
forming the hard mask over the silicon layer comprises forming a dielectric layer selected from the group consisting of thermal oxide, chemical vapor deposited oxide, pad oxide, and nitride.

22. The method of claim 17, wherein:
patterning the silicon layer to form the opening within the silicon layer defines a first location of the silicon device layer and a second location of the gallium nitride device layer.

23. The method of claim 17, wherein forming the gallium nitride device layer further comprises:
forming the gallium nitride device layer over the silicon device layer; and
planarizing the gallium nitride device layer to remove the gallium nitride device layer from over the silicon device layer.

24. The method of claim 17, wherein forming the hard mask comprises forming a hard mask having a top layer of silicon oxide; and
wherein forming the gallium nitride device layer further comprises growing the gallium nitride device layer within the opening in the silicon layer, wherein the top layer of silicon oxide inhibits the growth of the gallium nitride device layer over the silicon layer.

25. The method of claim 17, wherein the at least one silicon base semiconductor device is substantially coplanar with the at least one nitride-based semiconductor device.

26. The method of claim 17, wherein patterning the silicon layer comprises one of:
etching through the silicon layer and partially into the substrate; or
etching through the silicon layer and stopping at a surface of the substrate.

27. The method of claim 20, further comprising:
forming an oxide layer between the silicon wafer and the silicon layer.

28. An electronic system, comprising:
a power source;
at least one voltage regulator electrically coupled to the power source through a first power bus, wherein at least one voltage regulator is adapted to convert power from the power source;
a circuit die electrically coupled to the at least one voltage regulator through a second power bus; and
at least one of the power source, the at least one voltage regulator, and the circuit die comprises:
a substrate including a silicon device layer overlying the substrate and
a gallium nitride device layer overlying the substrate,
wherein the gallium nitride device layer does not directly underlie or directly overlie the silicon device layer;
at least one silicon-based semiconductor device; and
at least one nitride-based semiconductor device monolithically integrated on the substrate with the at least one silicon-based semiconductor device.

29. The electronic system of claim 28, wherein the at least one silicon-based semiconductor device is substantially coplanar with the at least one nitride-based semiconductor device.

30. The electronic system of claim 28, wherein
the silicon device layer does not directly underlie the gallium nitride device layer; and
the gallium nitride device layer does not directly underlie the silicon device layer.

31. The electronic system of claim 28, wherein the circuit die is a processor.

32. The electronic system of claim 28, wherein an active surface of the silicon device layer and an active surface of the gallium nitride device layer are substantially coplanar.

* * * * *